US012595196B2

(12) United States Patent
Iino

(10) Patent No.: US 12,595,196 B2
(45) Date of Patent: Apr. 7, 2026

(54) PH-ADJUSTED WATER PRODUCTION DEVICE

(71) Applicant: KURITA WATER INDUSTRIES LTD., Tokyo (JP)

(72) Inventor: Hideaki Iino, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 483 days.

(21) Appl. No.: 17/610,430

(22) PCT Filed: Feb. 25, 2020

(86) PCT No.: PCT/JP2020/007425
§ 371 (c)(1),
(2) Date: Nov. 10, 2021

(87) PCT Pub. No.: WO2020/250495
PCT Pub. Date: Dec. 17, 2020

(65) Prior Publication Data
US 2022/0242760 A1 Aug. 4, 2022

(30) Foreign Application Priority Data
Jun. 12, 2019 (JP) ................................. 2019-109577

(51) Int. Cl.
*C02F 1/20* (2023.01)
*C02F 1/42* (2023.01)
(Continued)

(52) U.S. Cl.
CPC .................. *C02F 1/66* (2013.01); *C02F 1/20* (2013.01); *C02F 1/42* (2013.01); *C02F 9/00* (2013.01);
(Continued)

(58) Field of Classification Search
CPC ...... C02F 1/66; C02F 1/20; C02F 1/68; C02F 2103/04; C02F 2103/346; C02F 2209/40;
(Continued)

(56) References Cited

U.S. PATENT DOCUMENTS 5,531,901 A * 7/1996 Miyabe .................... A62D 3/02
210/757
5,635,053 A * 6/1997 Aoki ................. H01L 21/02052
205/746
(Continued)

FOREIGN PATENT DOCUMENTS

JP 2003136077 5/2003
JP 2005229130 A * 8/2005 ....... H01L 21/02057
(Continued)

OTHER PUBLICATIONS

English Translation of Patent Publication JP 2007173677A, published Jul. 5, 2007. (Year: 2007).*
(Continued)

*Primary Examiner* — Joseph W Drodge
(74) *Attorney, Agent, or Firm* — JCIPRNET

(57) ABSTRACT

A pH-adjusted water production device has a configuration in which a platinum group metal support resin column, a membrane-type degassing device, and a gas dissolving membrane device are provided on an ultra-pure water supply line, and a pH-adjuster injection device is provided between the platinum group metal support resin column and the membrane-type degassing device. An inert gas source is connected to the gas phase side of the membrane-type degassing device while an inert gas source is connected also on the gas phase side of the gas dissolving membrane device, and a discharge line communicates with the gas dissolving membrane device.

4 Claims, 1 Drawing Sheet

(51) Int. Cl.

| | |
|---|---|
| *C02F 1/66* | (2023.01) |
| *C02F 9/00* | (2023.01) |
| *H01L 21/304* | (2006.01) |
| *C02F 103/04* | (2006.01) |

(52) U.S. Cl.
CPC ........ *H01L 21/304* (2013.01); *C02F 2103/04* (2013.01); *C02F 2301/08* (2013.01)

(58) Field of Classification Search
CPC .......... C02F 2301/046; C02F 2303/185; C02F 1/686; C02F 2209/06; C02F 2209/04; C02F 1/685; C02F 1/70; C02F 1/72; C02F 1/722; C02F 1/725; C02F 9/00; C02F 61/00; C02F 2303/18; C02F 1/42; C02F 2301/08; C02F 1/44; H01L 21/304; B01D 19/00; B01D 19/0005; B01D 19/0031; B01D 19/0036; B01D 61/00; B01D 61/58; B08B 3/10; B08B 3/12; B01J 20/0225; B01J 39/02; B01J 41/02; B01J 47/02; B01F 21/00; B01F 23/20; B01F 25/50

See application file for complete search history.

(56) References Cited

U.S. PATENT DOCUMENTS

| | | | | |
|---|---|---|---|---|
| 6,021,791 | A * | 2/2000 | Dryer | B01D 61/002 |
| | | | | 134/100.1 |
| 6,391,209 | B1 * | 5/2002 | Belongia | C25D 21/18 |
| | | | | 204/DIG. 13 |
| 6,416,586 | B1 * | 7/2002 | Ohmi | B08B 3/08 |
| | | | | 134/1 |
| 6,464,867 | B1 * | 10/2002 | Morita | C02F 1/78 |
| | | | | 210/202 |
| 10,759,678 | B2 * | 9/2020 | Fujimura | B01F 25/40 |
| 11,198,626 | B2 * | 12/2021 | Masaoka | B01F 25/50 |
| 11,325,851 | B2 * | 5/2022 | Fujimura | B01D 61/00 |
| 11,339,065 | B2 * | 5/2022 | Gan | C02F 1/58 |
| 2001/0027953 | A1 * | 10/2001 | Smith | C02F 1/72 |
| | | | | 210/97 |
| 2003/0094610 | A1 * | 5/2003 | Aoki | C01B 3/00 |
| | | | | 257/48 |
| 2003/0116174 | A1 * | 6/2003 | Park | C11D 7/02 |
| | | | | 134/1.3 |
| 2004/0063276 | A1 * | 4/2004 | Yamamoto | H01L 21/31662 |
| | | | | 257/E21.654 |
| 2008/0118418 | A1 * | 5/2008 | Morita | C02F 1/20 |
| | | | | 422/255 |
| 2009/0074611 | A1 * | 3/2009 | Monzyk | C01B 15/027 |
| | | | | 422/29 |
| 2009/0127201 | A1 * | 5/2009 | Kobayashi | B01J 31/08 |
| | | | | 210/668 |
| 2010/0044311 | A1 * | 2/2010 | Kobayashi | B01D 61/16 |
| | | | | 210/638 |
| 2012/0097595 | A1 * | 4/2012 | Tokoshima | C02F 1/705 |
| | | | | 210/251 |
| 2017/0044029 | A1 * | 2/2017 | Nakano | B01D 61/58 |
| 2017/0327396 | A1 * | 11/2017 | Ikuno | B01D 15/363 |
| 2020/0017384 | A1 * | 1/2020 | Fujimura | C02F 1/20 |
| 2020/0048116 | A1 * | 2/2020 | Gan | B01F 23/20 |

FOREIGN PATENT DOCUMENTS

| | | | | | |
|---|---|---|---|---|---|
| JP | | 2007000699 | | 1/2007 | |
| JP | | 2007173677 | A * | 7/2007 | |
| JP | | 2008086879 | A * | 4/2008 | |
| JP | | 2010017633 | | 1/2010 | |
| JP | | 2016076590 | | 5/2016 | |
| JP | | 2018049872 | | 3/2018 | |
| JP | | 2018167230 | | 11/2018 | |
| TW | | 201836993 | | 10/2018 | |
| WO | WO-2018179493 | A1 * | 10/2008 | ............ | B01D 19/00 |
| WO | WO-2018179492 | A1 * | 10/2018 | ............ | B01D 19/00 |

OTHER PUBLICATIONS

English Translation of Patent Publication WO 2018/179492A1, published Oct. 4, 2018. (Year: 2018).*

English Translation of Patent Publication WO 2018/179493A1, published Oct. 4, 2018. (Year: 2018).*

English Translation of Patent Publication JP-2008086879-A, published Apr. 2008. (Year: 2008).*

English Translation of Patent Publication JP 2005229130A, published Aug. 25, 2005. (Year: 2005).*

"International Search Report (Form PCT/ISA/210) of PCT/JP2020/007425," mailed on May 12, 2020, with English translation thereof, pp. 1-4.

"Office Action of Taiwan Counterpart Application", issued on May 6, 2024, with English translation thereof, p. 1-p. 10.

"Rejection Decision of Taiwan Counterpart Application", issued on Feb. 5, 2025, with English translation thereof, p. 1-p. 14.

\* cited by examiner

PH-ADJUSTED WATER PRODUCTION DEVICE

CROSS-REFERENCE TO RELATED APPLICATION

This application is a 371 application of the International PCT application serial no. PCT/JP2020/007425, filed on Feb. 25, 2020, which claims the priority benefit of Japan Patent Application No. 2019-109577, filed on Jun. 12, 2019. The entirety of each of the above-mentioned patent applications is hereby incorporated by reference herein and made a part of this specification.

TECHNICAL FIELD

The present invention relates to a pH-adjusted water production device used in electronics industry fields or the like, and particularly, to a pH-adjusted water production device capable of controlling pH to a high degree.

BACKGROUND ART

In a production process of electronic parts such as an LSI or the like, a process of processing a workpiece having a fine structure is repeated. Here, cleaning performed to remove fine particles, organic substances, metals, natural oxide films, and the like, attached to a surface of a processing body such as a wafer, a substrate, or the like, and achieving and maintaining a high degree of cleanliness are important for maintaining product quality and improving yield. The cleaning is performed using, for example, a cleaning solvent such as a mixed aqueous solution of sulfuric acid/hydrogen peroxide, a hydrofluoric acid solution, or the like, and rinsing using ultra-pure water is performed after the cleaning. A high purity is required for ultra-pure water or chemicals supplied in the cleaning such as the rinsing or the like. In addition, in recent years, the number of cleanings has been increasing due to refinement of semiconductor devices, divergence of materials and complication of processes.

In general, an ultra-pure water production device constituted by a pretreatment system, a primary pure water system, and a secondary pure water system (a sub-system) is used for production of ultra-pure water. In rinsing using the ultra-pure water produced by such an ultra-pure water production device, there is a problem that a thin oxide film may be formed on a wafer surface by dissolved oxygen in the ultra-pure water. In order to solve this problem, Patent Literatures 1 and 2 disclose a method of using water with dissolved hydrogen in which hydrogen gas is dissolved in ultra-pure water from which dissolved oxygen has been eliminated through degassing, and performing cleaning such as rinsing or the like using water in which hydrogen peroxide is reduced. In addition, Patent Literature 3 discloses a device configured to provide a conductive aqueous solution, a concentration of which is stable, by dissolving a conductive material as a raw material in ultra-pure water, and subsequently passing the dissolved material through an ion exchange tower filled with a porous organic ion exchanger.

Incidentally, in a production process of a semiconductor or a liquid crystal, cleaning of a semiconductor wafer or a glass substrate is performed using ultra-pure water, from which impurities have been eliminated to a high degree. In the cleaning of a semiconductor wafer using such ultra-pure water, in recent years, with the miniaturization thereof, there has been a problem that static electricity is likely to occur upon cleaning due to corrosion of a wiring metal due to a very small amount of hydrogen peroxide or the like included in the ultra-pure water and using ultra-pure water with a high specific resistance value, which causes electrostatic damage to an insulating film or reattachment of fine particles. For this reason, in recent years, pH adjustment has been performed by adding chemicals such as carbon dioxide, ammonia, or the like, to ultra-pure water, and thus, the above-mentioned problems are being addressed. Patent Literature 4 discloses that, in order to solve these problems, pH adjustment can be effectively utilized by adding a small amount of hydrogen peroxide and adjusting an oxidation reduction potential. In addition, it has been proposed that an inert gas be added to exclude dissolved oxygen.

CITATION LIST

Patent Literature

Patent Literature 1: Japanese Patent Laid-Open No. 2003-136077
Patent Literature 2: Japanese Patent Laid-Open No. 2010-017633
Patent Literature 3: Japanese Patent Laid-Open No. 2016-076590
Patent Literature 4: Japanese Patent Laid-Open No. 2018-167230

SUMMARY OF INVENTION

Technical Problem

However, in the technology disclosed in Patent Literatures 1 to 3, since dissolved gas species included in the added chemicals cannot be eliminated, it is difficult to deal with the problems that occur upon cleaning of an ultra-finely processed semiconductor device. In addition, in Patent Literature 4, while dissolving an inert gas is proposed, there is no mention of its effective concentration range. For this reason, a risk of oxygen in the atmosphere being dissolved cannot be avoided in the chamber in which cleaning of a substrate to be processed is actually performed. In the cleaning solvent used in these electronics industry fields or the like, it is desirable to eliminate dissolved oxygen and control the pH to a high degree.

In consideration of the above-mentioned problems, an objective of the present invention is directed to providing a pH-adjusted water production device capable of controlling pH to a high degree.

Solution to Problem

In consideration of the above-mentioned objective, the present invention provides a pH-adjusted water production device including sequentially: a platinum group metal support resin column and a membrane-type degassing device on an ultra-pure water supply line, wherein a pH-adjuster injection device configured to inject a pH adjuster is provided between the platinum group metal support resin column and the membrane-type degassing device, and the pH adjuster is ammonia, hydrochloric acid, citric acid or hydrofluoric acid (Invention 1).

According to such an invention (Invention 1), the small amount of hydrogen peroxide included in the ultra-pure water is eliminated by passing the ultra-pure water through the platinum group metal support resin column from the ultra-pure water supply line, the pH adjuster is continuously injected to prepare pH-adjusted water with a desired pH, and then the water is degassed by the membrane-type degassing device to eliminate dissolved oxygen in the pH-adjusted water, and thus, even in a chamber in which cleaning of a cleaning object such as a substrate to be processed is performed, it is possible to safely produce and supply high purity pH-adjusted water that reflects a desired pH. In particular, since the ammonia does not contain metal ions, it is easy to adjust the pH in an alkaline region and it is unlikely that these will be a hindrance, and similarly, since hydrochloric acid and citric acid also do not contain metal ions, it is easy to adjust the pH in an acidic region and it is unlikely that these will be a hindrance.

In the invention (Invention 1), the membrane-type degassing device may be an inert gas suction type (Invention 2).

According to such an invention (Invention 2), since the dissolved gas such as dissolved oxygen or the like is effectively degassed by suctioning the inert gas on a vapor phase side of the membrane-type degassing device and supplying the pH-adjusted water on a liquid phase side, a dissolved oxygen concentration of the obtained pH-adjusted water can be further reduced, and high purity pH-adjusted water that reflects a desired pH can be improved.

In the invention (Inventions 1 and 2), an inert gas dissolving device may be provided at a stage subsequent to the membrane-type degassing device (Invention 3). In particular, in the invention (Invention 3), a mechanism configured to maintain a concentration of the inert gas at 15 ppm or more may be provided (Invention 4).

According to such an invention (Inventions 3 and 4), by dissolving an inert gas in the high purity pH-adjusted water to the vicinity of the saturation solubility, it is possible to make it unlikely for gas components to dissolve in the obtained pH-adjusted water and maintain a state in which the desired pH is accurately reflected.

In the invention (Inventions 1 to 4), a pH measurement part may be provided at a stage subsequent to the membrane-type degassing device (Invention 5).

According to such an invention (Invention 5), an added amount of the pH adjuster can be controlled so that the obtained pH-adjusted water has a desired pH based on the measurement result of the pH measurement part.

In the invention (Inventions 3 to 5), a gas concentration measurement part may be provided at a stage subsequent to the membrane-type degassing device (Invention 6).

According to such an invention (Invention 6), an inert gas concentration can be controlled such that the obtained pH-adjusted water has a desired inert gas concentration based on the measurement result of the inert gas concentration measurement part.

Effects of Invention

According to the pH-adjusted water production device of the present invention, it is possible to safely produce and supply high purity pH-adjusted water that reflects a desired pH by firstly eliminating a small amount of hydrogen peroxide and dissolved oxygen included in ultra-pure water using a platinum group metal support resin column and subsequently eliminating the dissolved oxygen in the pH-adjusted water by degassing with a membrane-type degassing device after a pH adjuster is continuously injected to prepare the pH-adjusted water.

DESCRIPTION OF EMBODIMENTS

Hereinafter, an embodiment of a pH-adjusted water production device of the present invention will be described in detail with reference to the accompanying drawings.

[pH-Adjusted Water Production Device]

Figure 1:
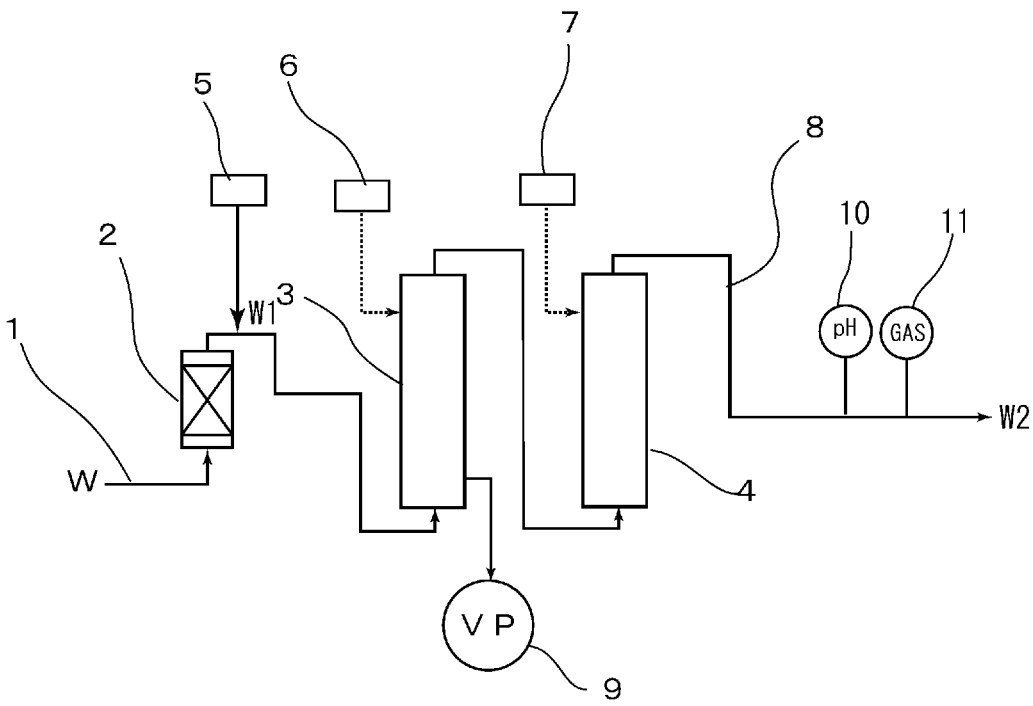
FIG. 1 is a schematic view showing a pH-adjusted water production device according to an embodiment of the present invention.

FIG. 1 shows a pH-adjusted water production device of an embodiment, and the pH-adjusted water production device in FIG. 1 has a configuration in which a platinum group metal support resin column 2, a membrane-type degassing device 3 and a gas dissolving membrane device 4 are sequentially provided on a supply line 1 for ultra-pure water W as processed raw water, and a pH-adjuster injection device 5 is provided between the platinum group metal support resin column 2 and the membrane-type degassing device 3. Further, a nitrogen gas source 6 serving as an inert gas source is connected to the membrane-type degassing device 3 on a vapor phase side, a nitrogen gas source 7 serving as an inert gas source is also connected to the gas dissolving membrane device 4 on the vapor phase side, and a discharge line 8 for pH-adjusted water communicates with the gas dissolving membrane device 4. A PH meter 10 serving as a pH measurement part and a nitrogen gas concentration meter 11 serving as a concentration measurement part are provided on the discharge line 8. Here, in the embodiment, the pH meter 10 and the pH-adjuster injection device 5 are connected to a control part (not shown), and the control part can adjust an injection volume of the pH-adjuster injection device 5 based on a measurement value of the pH meter 10. Further, the nitrogen gas concentration meter 11 is also connected to the control part (not shown), a flow regulating valve connected to the control part is provided in the nitrogen gas source 7, and thus, a flow rate of a nitrogen gas can be adjusted based on the measurement value of the nitrogen gas concentration meter 11. Further, reference numeral 9 designates a vacuum pump of the membrane-type degassing device 3.

<Ultra-Pure Water>

In the embodiment, as the ultra-pure water W that is processed raw water, for example, specific resistance: 18.1 MΩ·cm or more, fine particles: 1000 particles/L or less with a particle diameter of 50 nm or more, viable bacteria: 1 bacterium/L or less, TOC (Total Organic Carbon): 1 µg/L or less, total silicon: 0.1 µg/L or less, metals: 1 ng/L or less, ions: 10 ng/L or less, hydrogen peroxide; 30 µg/L or less and water temperature: 25±2° C. are appropriate.

<Platinum Group Metal Support Resin Column>

(Platinum Group Metal)

In the embodiment, as a platinum group metal supported on a platinum group metal-carrying resin using the platinum group metal support resin column 2, ruthenium, rhodium, palladium, osmium, iridium and platinum can be exemplified. These platinum group metals can be used alone, in combination of two or more, or as an alloy of two or more, and a refined product of a naturally produced mixture thereof can be used without separation into single substances. Platinum, palladium, platinum/palladium alloys alone or a mixture of two or more of these are particularly preferably used because of their strong catalytic activity. In addition, nano-order fine particles of these metals can also be used particularly preferably.

(Carrier Resin)

In the platinum group metal support resin column 2, an ion exchange resin can be used as a carrier resin for supporting the platinum group metal. With regard to this, an anion exchange resin is particularly preferably used. Since the platinum-based metal is negatively charged, it is stably supported on the anion exchange resin and is unlikely to peel off. An exchange group of the anion exchange resin is preferably an OH type. In the OH type anion exchange resin, the resin surface becomes alkaline and promotes decomposition of hydrogen peroxide.

<Membrane-Type Degassing Device>

In the embodiment, as the membrane-type degassing device 3, it is possible to use a configuration in which the ultra-pure water W flows toward one side of a degassing membrane (a liquid phase side), and the other side (a vapor phase side) is exhausted by a vacuum pump 9, and thus, dissolved oxygen permeates through the membrane and is transferred toward the gas phase chamber for removal. Further, it is preferable to connect the nitrogen gas source 6 serving as the inert gas source to the membrane on a vacuum side (a vapor phase side) to improve a degassing performance. The degassing membrane may be a membrane that allows a gas such as oxygen, nitrogen, water vapor, or the like, to pass through but does not allow water to permeate therethrough, and may be formed of, for example, silicon rubber, polytetrafluoroethylene, a polyolefin, polyurethane, or the like. As the degassing membrane, various commercially available ones can be used.

<Gas Dissolving Membrane Device>

In the embodiment, the gas dissolving membrane device 4 is not particularly limited as long as the ultra-pure water W flows toward one side of a gas permeating membrane (the liquid phase side) and the gas is circulated on the other side (the vapor phase side) to be transferred and dissolved on the liquid phase side, and for example, a polymer membrane such as polypropylene, polydimethylsiloxane, polycarbonate-polydimethylsiloxane block copolymer, polyvinylphenol-polydimethylsiloxane-polysulfone block copolymer, poly(4-methylpentene-1), poly(2,6-dimethylphenylene oxide), polytetrafluoroethylene, or the like, can be used. As the gas dissolved in the water, nitrogen gas is used as an inert gas in the embodiment, and the nitrogen gas as the inert gas is supplied from the nitrogen gas source 7.

<pH Adjuster>

In the embodiment, when the pH is adjusted to less than 7, hydrochloric acid, citric acid or hydrofluoric acid is preferably used as a pH adjuster injected from the pH-adjuster injection device 5, and in addition, when the pH is adjusted to 7 or more, ammonia can be used. Further, an alkali metal solution such as sodium hydroxide or the like is not preferable because it may contain metal components. For example, when a cleaning solvent for a transition metal or a semiconductor material is prepared, it is desirable to adjust the pH optimally in order to minimize elution of these materials, and in particular, it is desirable to adjust the pH to 9 or more for copper or cobalt, and adjust the pH to 3 or lower for tungsten or molybdenum.

[Method of Producing pH-Adjusted Water]

A method of producing high purity pH-adjusted water using the pH-adjusted water production device of the embodiment having the above-mentioned configuration will be described below.

First, the ultra-pure water W serving as raw water is supplied to the platinum group metal support resin column 2 from the supply line 1. In the platinum group metal support resin column 2, hydrogen peroxide in the ultra-pure water W is decomposed and eliminated by a catalytic action of the platinum group metal. However, herein, the amount of dissolved oxygen in the ultra-pure water W tends to increase slightly due to decomposition of the hydrogen peroxide.

Next, the pH adjuster is injected into the ultra-pure water from the pH-adjuster injection device 5 to prepare pH-adjusted water W 1. The pH adjuster injection volume (flow rate) may be controlled by a control part (not shown) according to the flow rate of the ultra-pure water W so that the obtained cleaning chemical has a desired pH. As a result, the pH-adjusted water contains the dissolved oxygen of the ultra-pure water W and the dissolved oxygen brought in from the pH adjuster.

Next, the pH-adjusted water W1 is supplied to the membrane-type degassing device 3. In the membrane-type degassing device 3, the pH-adjusted water W1 flows toward the liquid phase chamber constituted by the hydrophobic gas transmission membrane and the liquid phase chamber of the gas phase chamber, the gas phase chamber is decompressed by a vacuum pump (not shown), and thus, the dissolved gas such as the dissolved oxygen or the like contained in the pH-adjusted water W1 passes through the hydrophobic gas transmission membrane to be transferred to the gas phase chamber and eliminated. Here, the condensed water generated on the side of the gas phase chamber is collected in a drain tank (not shown). In the embodiment, nitrogen gas ($N_2$ gas) serving as sweep gas is decompressed and supplied from the nitrogen gas source 6 serving as the inert gas source to the gas phase chamber of the membrane-type degassing device 3, and thus the degassing effect is desirably enhanced and the dissolved oxygen elimination effect of the pH-adjusted water is further enhanced.

Here, in the embodiment, while nitrogen gas is used as the inert gas, there is no particular limitation thereto and a rare gas or the like can also be used. However, since nitrogen gas is easily available and inexpensive even at a high purity level, it is preferably used.

Next, in the embodiment, the degassed pH-adjusted water W1 is supplied to the gas dissolving membrane device 4. In the gas dissolving membrane device 4, the pH-adjusted water W1 flows toward the liquid phase chamber constituted by the hydrophobic gas transmission membrane and the liquid phase chamber of the gas phase chamber, nitrogen gas ($N_2$ gas) is supplied to the gas phase chamber from the nitrogen gas source 7 serving as the inert gas source under a condition in which the pressure on the side of the gas phase chamber is higher than that on the side of the liquid phase chamber, thus, the nitrogen gas ($N_2$ gas) is transferred toward the liquid phase chamber to be dissolved in the pH-adjusted water W1, and finally, pH-adjusted water (clean pH-adjusted water) W2 can be obtained. Here, the condensed water generated on the side of the gas phase chamber is collected in a drain tank (not shown). Redissolution of a gas species to the clean pH-adjusted water W2 can be minimized by dissolution of the nitrogen gas ($N_2$ gas), the clean pH-adjusted water W2 can be maintained in a state in which the dissolved oxygen is reduced, and fluctuation of the pH can also be minimized. With such a method using a gas dissolving membrane module, the gas can be easily dissolved in the water, and the dissolved gas concentration can also be easily adjusted and managed.

Here, in the embodiment, while nitrogen gas is used as the inert gas, there is no particular limitation thereto and a rare gas or the like can also be used. However, since nitrogen gas is easily available and inexpensive even at a high purity level, it is preferably used.

In the above-mentioned pH-adjusted water production method of the clean pH-adjusted water W2, the pH meter 10 is installed at a stage subsequent to the gas dissolving membrane of the membrane-type degassing device 3 and, in the embodiment, the subsequent stage of the gas dissolving membrane device 4, the pH of the pH-adjusted water W1 is measured, the control part is provided to be connected to each of the pH meter 10 and the pH-adjuster injection device 5, the injection volume of the pH adjuster is adjusted according to the measurement value of the pH meter 10, and thus, the pH can be accurately controlled.

Further, the nitrogen gas concentration meter 11 is installed at the subsequent stage of the gas dissolving membrane of the membrane-type degassing device 3 and, in the embodiment, the subsequent stage of the gas dissolving membrane device 4 to measure a nitrogen gas concentration, a gas flow regulating valve or the like is provided on the nitrogen gas source 6 according to necessity, the control part is provided to be connected to each of the nitrogen gas concentration meter 11 and the gas flow regulating valve, a flow rate of the nitrogen gas source 7 is adjusted according to the $N_2$ gas dissolving concentration, and thus, a nitrogen gas concentration can be controlled so that it is always in the vicinity of the saturation solubility (for example, 15 ppm or more). Accordingly, the dissolved oxygen concentration of the pH-adjusted water W1 can be reduced to an extremely low level, and fluctuation of the pH can be further minimized. Moreover, the saturated $N_2$ gas can minimize dissolving of oxygen from the atmosphere that occurs when the cleaning solvent is discharged from the nozzle tip and applied to substrate to be processed to reach an end portion of the substrate to be processed.

The pH-adjusted water W1 produced according to the above-mentioned embodiment, in particular, the clean pH-adjusted water W2 is supplied to a cleaning machine of an electronic material such as a silicon substrate for a semiconductor, a glass substrate for a liquid crystal, a quartz substrate for a photomask, or the like.

Hereinabove, while the present invention has been described with reference to the accompanying drawings, the present invention is not limited to the embodiment and various modifications may be made. For example, the pH meter 10 and/or the nitrogen gas concentration meter 11 do not need to be provided at the stage subsequent to the gas dissolving membrane device 4 despite in the embodiment being provided at the stage subsequent to the gas dissolving membrane device 4, and may be provided at a stage in front of the gas dissolving membrane device 4 at the stage subsequent to the gas dissolving membrane of the membrane-type degassing device 3. In addition, meters such as a flowmeter, a thermometer, a pressure gauge, a gas concentration meter, and the like, can be placed at arbitrary places. Further, according to necessity, an oxidation reduction potential modifier injection device may be installed, and a chemical flow regulating valve may be installed. Further, an injection device for other chemicals may be provided on a pH-adjusted water production device.

EXAMPLES

The present invention will be described in more detail according to the following specific examples.

Example 1

The pH-adjusted water production device was configured as shown in FIG. 1, the ultra-pure water W was supplied from the supply line 1 at a flow rate of 3 L/min and distributed to the platinum group metal support resin column 2 that supports the platinum as the platinum group metal, and then, ammonia aqueous solution (a concentration of 28 wt %) was supplied from the pH-adjuster injection device 5 so that the pH was within a range of 9.5 to 10.2 to prepare the pH-adjusted water W1. The clean pH-adjusted water W2 was produced by degassing the pH-adjusted water W1 using the membrane-type degassing device 3 and adjusting the nitrogen gas using the gas dissolving membrane device 4 to a 15 ppm close to the saturation concentration via the gas dissolving membrane. The pH of the clean pH-adjusted water W2 was measured by the pH meter 10. In addition, the clean pH-adjusted water W2 was collected in a beaker, and the dissolved oxygen concentration after being left in the air for five minutes was measured using a dissolved oxygen meter. These results are shown in Table 1.

Further, Liqui-Cel (manufactured by Celgard, LLC) was used as the membrane-type degassing device 3, and nitrogen gas as sweep gas was distributed at a flow rate of 10 L/min. In addition, "MHF1704" manufactured by Mitsubishi Rayon Co., Ltd., was used as the gas dissolving membrane device 4, nitrogen gas was supplied at a flow rate of 0.5 L/min, and nitrogen gas was saturated and dissolved.

Example 2

In Example 1, the clean pH-adjusted water W2 was produced in the same manner except that the inert gas was not supplied to the gas dissolving membrane device 4. The pH of the clean pH-adjusted water W2 was measured by the pH meter 10. In addition, the clean pH-adjusted water W2 was collected in a beaker, and measured using a dissolved oxygen meter. The results are shown in Table 1.

Comparative Example 1

Figure 2:
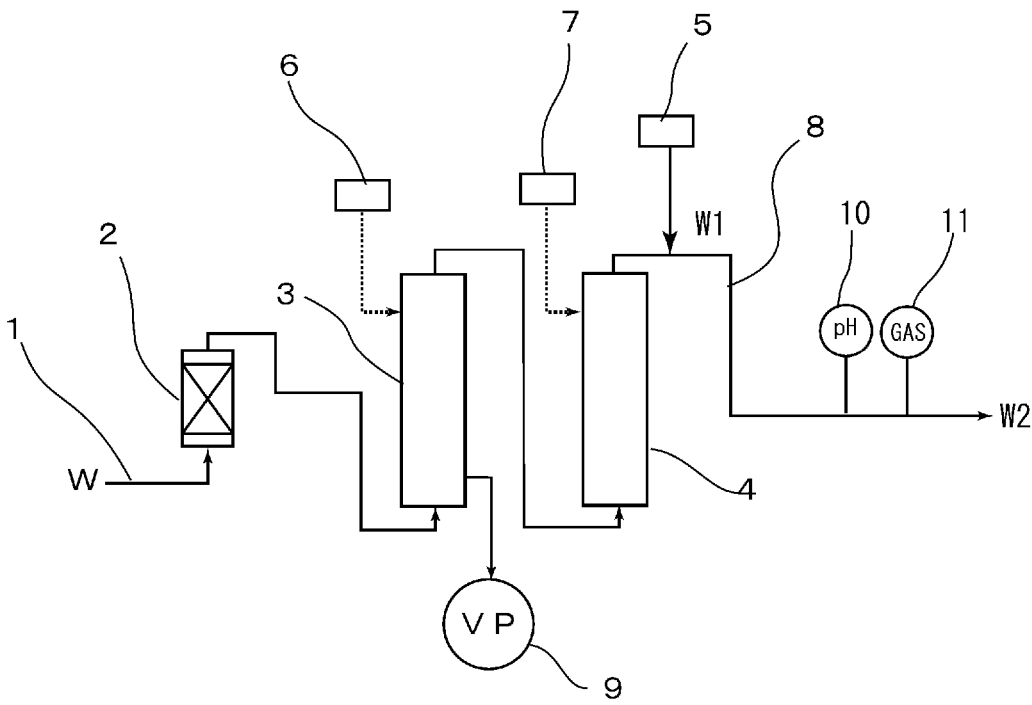
FIG. 2 is a schematic view showing a pH-adjusted water production device according to Comparative example 1.

As shown in FIG. 2, the pH-adjusted water production device was configured in the same manner except that ammonia aqueous solution (a concentration of 28 wt %) was supplied from the pH-adjuster injection device 5 so that the pH was within a range of 9.5 to 10.2 to prepare the clean pH-adjusted water W2 at the subsequent stage of the gas dissolving membrane device 4 in the device shown in FIG. 1. The clean pH-adjusted water W2 was produced by the pH-adjusted water production device like Example 1. The pH of the clean pH-adjusted water W2 was measured by the pH meter 10. In addition, the clean pH-adjusted water W2 was collected in a beaker and measured using a dissolved oxygen meter. The results are shown in Table 1.

TABLE 1

| No. | Example 1 | Example 2 | Comparative example 1 |
|---|---|---|---|
| pH | 9.6 | 9.6 | 8.8 |
| Dissolved oxygen concentration | <50 ppb | >1 ppb | <50 ppb |

Example 3

In Example 1, the clean pH-adjusted water W2 was produced in the same manner as in Example 1 except that the hydrochloric acid was supplied from the pH-adjuster injection device 5 so that the pH was within a range of 2.5 to 3.2 to prepare the pH-adjusted water W1, and measured by the pH meter 10. In addition, the clean pH-adjusted water W2 was collected in a beaker and measured using a dissolved oxygen meter. These results are shown in Table 2.

Example 4

In Example 3, the clean pH-adjusted water W2 was produced in the same manner except that the inert gas was not supplied to the gas dissolving membrane device 4. The pH of the clean pH-adjusted water W2 was measured by the pH meter 10. In addition, the clean pH-adjusted water W2 was collected in a beaker and measured using a dissolved oxygen meter. The results are shown in Table 2.

Comparative Example 2

In Example 3, the clean pH-adjusted water W2 was produced in the same manner as in Example 3 except that hydrochloric acid was supplied from the pH-adjuster injection device 5 at the subsequent stage of the gas dissolving membrane device 4 and the pH was adjusted to be within a range of pH 2.5 to 3.2, and measured by the pH meter 10. In addition, the clean pH-adjusted water W2 was collected in a beaker and measured using a dissolved oxygen meter. The results are shown in Table 2.

TABLE 2

| No. | Example 3 | Example 4 | Comparative example 2 |
|---|---|---|---|
| pH | 3.0 | 3.0 | 3.4 |
| Dissolved oxygen concentration | <50 ppb | >1 ppb | <10 ppb |

As will be apparent from Table 1 and Table 2, in the pH-adjusted water production device of Example 1 and Example 3, the pH was within a target range and the dissolved oxygen concentration was within a target range of less than 50 ppb. In addition, in the pH-adjusted water production device of Example 2 and Example 4 to which the inert gas was not supplied by the gas dissolving membrane device 4 (assuming a device in which the gas dissolving membrane device 4 is not provided), while the pH was within the target range, the dissolved oxygen concentration was increased. On the other hand, in the pH-adjusted water production device of Comparative examples 1 and 2, while the pH value was outside the target value, the dissolved oxygen concentration was low. It is considered that controllability is decreased as an injection position of the pH adjuster becomes closer to a pH measurement position and affected by the dissolved oxygen dissolved in the ammonia aqueous solution supplied from the pH-adjuster injection device 5.

REFERENCE SIGNS LIST

1 Supply line
2 Platinum group metal support resin column

3 Membrane-type degassing device
4 Gas dissolving membrane device
5 pH-adjuster injection device
6 Nitrogen gas source (inert gas source)
7 Nitrogen gas source (inert gas source)
8 Discharge line
9 Vacuum pump
10 pH meter (pH measurement part)
11 Nitrogen gas concentration meter (inert gas concentration measurement part)
W Ultra-pure water
W1 pH-adjusted water
W2 Clean pH-adjusted water

What is claimed is:

1. A method of providing pH-adjusted water production comprising sequentially providing: a platinum group metal support resin column and a membrane-type degassing device on an ultra-pure water supply line, wherein the membrane-type degassing device includes a membrane, providing a pH-adjuster injection device, configured to inject a pH adjuster, is between the platinum group metal support resin column and the membrane-type degassing device, wherein the pH adjuster is ammonia, hydrochloric acid, citric acid or hydrofluoric acid, providing an inert gas dissolving device, configured to dissolve an inert gas, at a stage subsequent to the membrane-type degassing device, providing a gas concentration measurement part is provided at a stage subsequent to the membrane-type degassing device and the inert gas dissolving device, and providing a mechanism to maintain a concentration of the inert gas, comprising a gas flow regulating valve and a control part, wherein the control part is connected to each of the gas concentration measurement part and the gas flow regulating valve, and the mechanism to maintain the concentration of the inert gas always in the vicinity of or more than a saturation solubility of the inert gas and at 15 ppm or more at the stage subsequent to the inert gas dissolving device, so as to maintain a saturated state of the inert gas in the subsequent stage.

2. The method of providing pH-adjusted water production device according to claim 1, wherein the membrane-type degassing device is configured to inject the inert gas by applying suction.

3. The method of providing pH-adjusted water production device according to claim 1, further comprising providing a pH measurement part at the stage subsequent to the membrane-type degassing device and the inert gas dissolving device.

4. The method of providing pH-adjusted water production device according to claim 1, wherein the control part comprises a processor.

* * * * *